(12) United States Patent
Kawai

(10) Patent No.: US 12,101,093 B2
(45) Date of Patent: Sep. 24, 2024

(54) ELECTRONIC CIRCUITRY AND CONTROL SYSTEM

(71) Applicant: KABUSHIKI KAISHA TOSHIBA, Tokyo (JP)

(72) Inventor: Shusuke Kawai, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 18/185,071

(22) Filed: Mar. 16, 2023

(65) Prior Publication Data
US 2024/0048134 A1 Feb. 8, 2024

(30) Foreign Application Priority Data

Aug. 5, 2022 (JP) .................................. 2022-125825

(51) Int. Cl.
*H03K 5/135* (2006.01)
*H03K 5/05* (2006.01)
*H02P 27/08* (2006.01)
*H03K 5/00* (2006.01)

(52) U.S. Cl.
CPC .............. *H03K 5/135* (2013.01); *H03K 5/05* (2013.01); *H02P 27/08* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 6,924,679 B2 * | 8/2005 | Seno ..................... | G06F 1/3203 327/158 |
| 7,199,634 B2 * | 4/2007 | Cho ...................... | H03L 7/0812 327/175 |
| 9,811,056 B2 * | 11/2017 | Cho ....................... | H03K 5/135 |

OTHER PUBLICATIONS

Ken Tanaka et al., "The Effect of Sound Delay Conditions on Electronic Drum Performance," The Acoustical Society of Japan Musical Acoustics Study Group, vol. 31, No. 8, 6 pages, and translation, 7 pages (2013).
Yash Sukhatme et al.. "Digitally Controlled Gate Current Source-Based Active Gate Driver for Silicon Carbide MOSFETs," IEEE Trans. on Ind. Elecs., vol. 67, No. 12, pp. 10121-10133 (2020).

* cited by examiner

*Primary Examiner* — Cassandra F Cox
(74) *Attorney, Agent, or Firm* — Finnegan, Henderson, Farabow, Garrett & Dunner, LLP

(57) ABSTRACT

In one embodiment, electronic circuitry includes a reference circuit configured to generate a reference pulse signal synchronized with a clock signal on the basis of an input pulse signal, a delay circuit configured to delay the reference pulse signal and generate a delayed pulse signal, and an output circuit configured to output a pulse train including a plurality of pulses synchronized with the clock signal on the basis of the reference pulse signal and the delayed pulse signal, and the clock signal.

9 Claims, 15 Drawing Sheets

ELECTRONIC CIRCUITRY AND CONTROL SYSTEM

REFERENCE TO RELATED APPLICATIONS

This application is based upon and claims the benefit of priority from the prior Japanese Patent Application No. 2022-125825, filed on Aug. 5, 2022, the entire contents of which are incorporated herein by reference.

TECHNICAL FIELD

The present embodiment relates to electronic circuitry and a control system.

BACKGROUND ART

In the field of power electronics, a silicon (Si) or silicon carbide (SiC) MOSFET (Metal Oxide Semiconductor Field Effect Transistor) or IGBT (Insulated Gate Bipolar Transistor), or a semiconductor switching element of, e.g., GaN is used. In a circuit including such a switching element, power loss can be reduced by speeding up switching operation of the element. However, speeding up switching operation of an element too much causes generation of noise. That is, there is a tradeoff between reduction in power loss and noise suppression.

As a method for optimizing the above-described tradeoff, active gate control technology has been studied. The active gate control technology experimentally and theoretically determines in advance waveforms of a drive signal during turn-on and turn-off of a switching element so as to achieve both reduction in power loss and noise suppression and stores waveform data of the waveforms in a memory circuit. A drive circuit for the switching element generates a drive signal on the basis of the waveform data read out from the memory circuit and drives the switching element by the drive signal.

For example, to perform PWM control on switching operation of the switching element, the drive circuit needs to read out waveform data from the memory circuit in accordance with a pulse signal (PWM signal) which instructs switching operation.

The present embodiment is intended to provide electronic circuitry capable of generating a pulse train including a plurality of pulses in accordance with an input pulse signal.

To solve the above-described problem, an electronic circuitry according to an embodiment comprises: a reference circuit configured to generate a reference pulse signal synchronized with a clock signal on the basis of an input pulse signal, a delay circuit configured to delay the reference pulse signal and generate a delayed pulse signal, and an output circuit configured to output a pulse train including a plurality of pulses synchronized with the clock signal on the basis of the reference pulse signal and the delayed pulse signal, and the clock signal.

A electronic circuitry according to an embodiment comprises: a reference circuit configured to generate a reference pulse signal synchronized with a clock signal on the basis of an input pulse signal, a delay circuit configured to delay the reference pulse signal and generate a delayed pulse signal, an output circuit configured to output a pulse train including a plurality of pulses synchronized with the clock signal on the basis of the reference pulse signal and the delayed pulse signal, and the clock signal, a memory circuit configured to sequentially output waveform data in sync with the pulses included in the pulse train when the pulse train generated by the output circuit is input, and a signal generation circuit configured to generate a drive signal for a switching element on the basis of the waveform data.

A control system according to an embodiment comprises: a reference circuit configured to generate a reference pulse signal synchronized with a clock signal on the basis of an input pulse signal, a delay circuit configured to delay the reference pulse signal and generate a delayed pulse signal, an output circuit configured to output a pulse train including a plurality of pulses synchronized with the clock signal on the basis of the reference pulse signal and the delayed pulse signal, and the clock signal, a plurality of memory circuits configured to sequentially output waveform data in sync with the pulses included in the pulse train when the pulse train generated by the output circuit is input, a signal generation circuit configured to generate a drive signal for a switching element on the basis of the waveform data, a first selection circuit configured to select any one of the plurality of memory circuits and input the pulse train generated by the output circuit to the selected memory circuit, on the basis of a selection signal, a second selection circuit configured to input the waveform data output from any one of the plurality of memory circuits to the signal generation circuit on the basis of the selection signal, a detection circuit configured to detect an operating state of the switching element, and a control circuit configured to generate the input pulse signal and the selection signal on the basis of the operating state.

DETAILED DESCRIPTION

Figure 1:
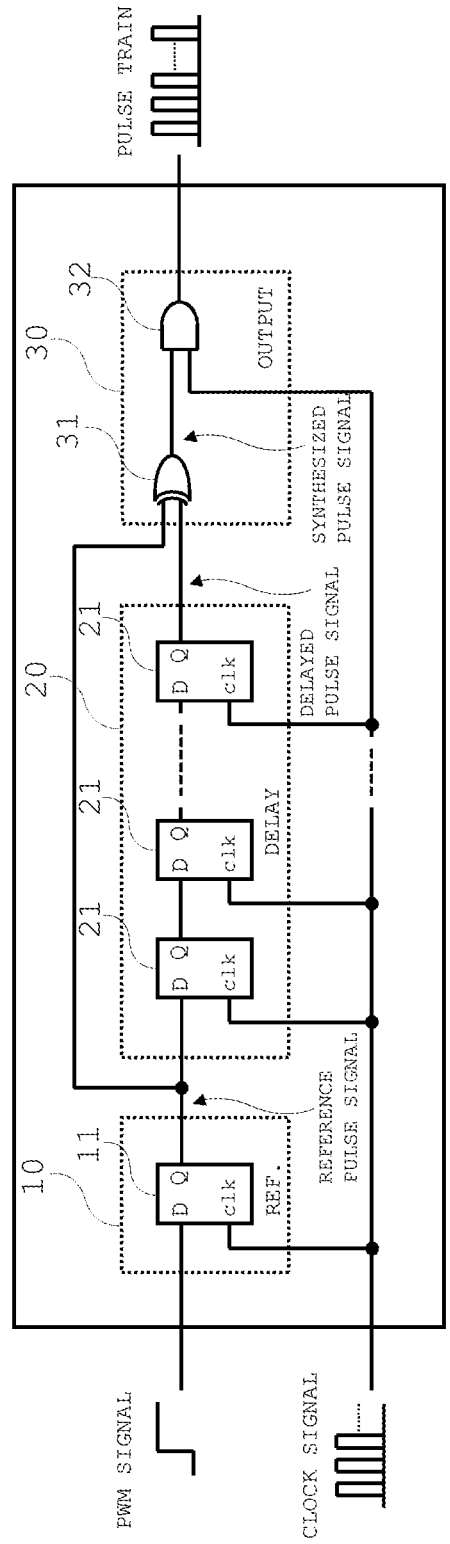
FIG. 1 illustrates a configuration of electronic circuitry according to Embodiment 1.

Embodiments will be described below with reference to the drawings. Identical or corresponding elements are denoted by the same references in the drawings, and a detailed description thereof will be appropriately omitted.

Embodiment 1

Figure 2:
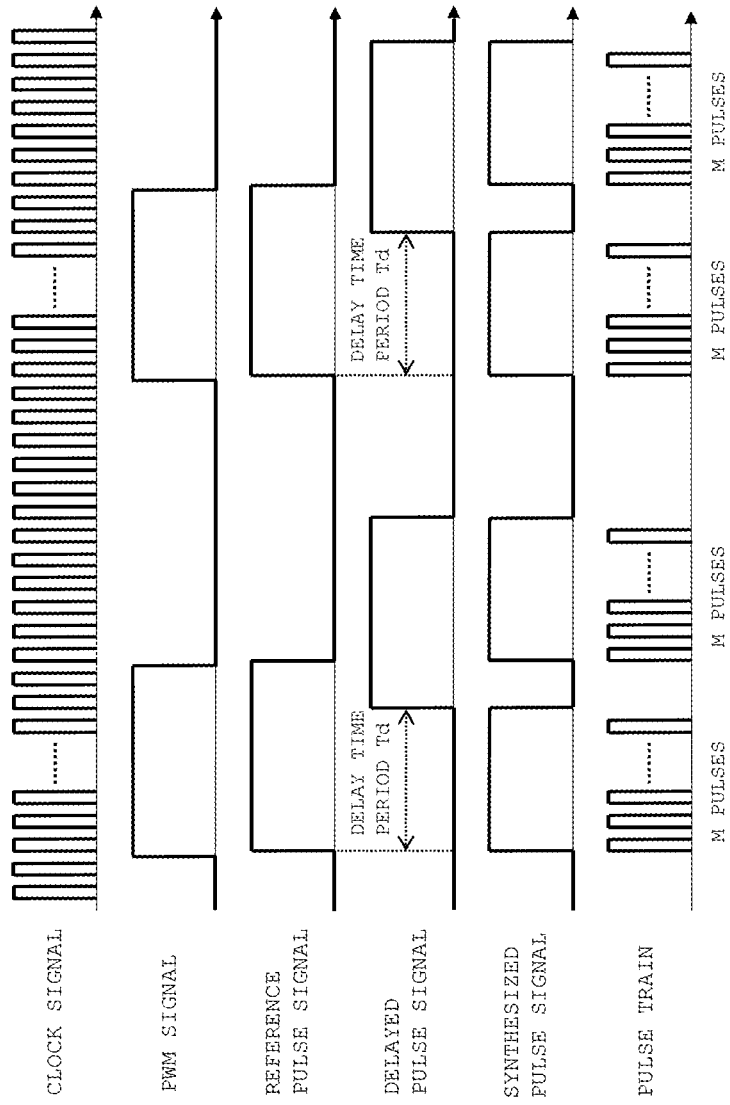
FIG. 2 is a timing chart of respective signals at components of electronic circuitry according to Embodiment 1.

FIG. 1 illustrates a configuration of electronic circuitry 100 according to Embodiment 1. FIG. 2 is a timing chart of respective signals at components of electronic circuitry 100. A clock signal and a PWM signal (command signal) which instructs switching operation, such as turn-on and turn-off, of a switching element are input to electronic circuitry 100. Electronic circuitry 100 generates and outputs a pulse train including "M" pulses synchronized with the clock signal in accordance with the PWM signal. Electronic circuitry 100 comprises a reference circuit 10, a delay circuit 20 and an output circuit 30. Note that synchronism encompasses not only exact coincidence in rise time and fall time but also deviation in time allowable in electronic circuitry 100, or a circuit or a system equipped with electronic circuitry 100.

The reference circuit 10 generates a reference pulse signal synchronized with the clock signal on the basis of the PWM signal (see FIG. 2). For example, the reference circuit 10 is composed of a D flip-flop 11. When a rising edge of the PWM signal is input to the D terminal of the D flip-flop 11, a rising edge of the reference pulse signal is output from the Q terminal at a timing synchronized with the clock signal. When a falling edge of the PWM signal is input to the D terminal of the D flip-flop 11, a falling edge of the reference pulse signal is output from the Q terminal at a timing synchronized with the clock signal.

The delay circuit 20 delays the reference pulse signal generated by the reference circuit 10 and generates a delayed pulse signal (see FIG. 2). For example, if a pulse train including "M" pulses synchronized with the clock signal is desired to be generated, a delay time period "Td" of the delay circuit 20 is set to satisfy Tc*(M−1)<Td<=Tc*M, where "Tc" is a period of the clock signal.

For example, the delay circuit 20 is constructed by connecting "M" D flip-flops 21. When the reference pulse signal is input to the D terminal of a first D flip-flop 21, the delayed pulse signal is output from the Q terminal of a last D flip-flop 21 at a timing after "M" clocks has passed. In this case, the delay time period "Td" is "M" times the period "Tc" of the clock signal, i.e., Td=Tc*M.

The output circuit 30 outputs a pulse train including "M" pulses synchronized with the clock signal on the basis of the reference pulse signal and the delayed pulse signal, and the clock signal. For example, the output circuit 30 is composed of an EXOR gate 31 as a synthesis circuit which generates a synthesized pulse signal on the basis of the reference pulse signal and the delayed pulse signal and an AND gate 32 as a generation circuit which generates a pulse train including "M" pulses on the basis of the synthesized pulse signal and the clock signal.

The EXOR gate 31 receives the reference pulse signal and the delayed pulse signal and outputs a synthesized pulse signal having a pulse width corresponding to the delay time period "Td" (see FIG. 2). The AND gate 32 receives the synthesized pulse signal and the clock signal and outputs the pulse train including the "M" pulses synchronized with the clock signal (see FIG. 2).

As described above, electronic circuitry 100 according to Embodiment 1 comprises the reference circuit 10 that generates a reference pulse signal synchronized with a clock signal on the basis of a PWM signal (input pulse signal), the delay circuit 20 that delays the reference pulse signal and generates a delayed pulse signal, and the output circuit 30 that outputs a pulse train including "M" pulses synchronized with the clock signal on the basis of the reference pulse signal and the delayed pulse signal, and the clock signal. With these features, electronic circuitry 100 according to Embodiment 1 can generate a pulse train including "M" pulses in accordance with an input pulse signal. More particularly, electronic circuitry 100 according to Embodiment 1 can generate a pulse train including "M" pulses in response to each of rising edges and falling edges of the input pulse signal.

In electronic circuitry 100 according to Embodiment 1, the reference circuit 10 is composed of the single D flip-flop 11, the delay circuit 20 is constructed by connecting the "M" D flip-flops 21, and the output circuit 30 is composed of the EXOR gate 31 and the AND gate 32. With these features, electronic circuitry 100 according to Embodiment 1 has a small-scale and low-power-consumption circuit configuration.

If a pulse train including "M" pulses synchronized with a clock signal is desired, the delay time period "Td" of the delay circuit 20 may be set to satisfy Tc*(M−1)<Td<=Tc*M, where "Tc" is a period of the clock signal. With this feature, electronic circuitry 100 according to Embodiment 1 can generate a pulse train including a desired number of pulses by adjusting the delay time period "Td" of the delay circuit 20

In electronic circuitry 100 according to Embodiment 1, the delay circuit 20 is constructed by connecting the "M" D flip-flops. Alternatively, the delay circuit 20 may be composed of an analog circuit including a resistor, a capacitor, and the like. Alternatively, the delay circuit 20 may be composed of a one-shot circuit or a monostable multivibrator circuit including a resistor, a capacitor, a transistor, and the like.

Figure 3:
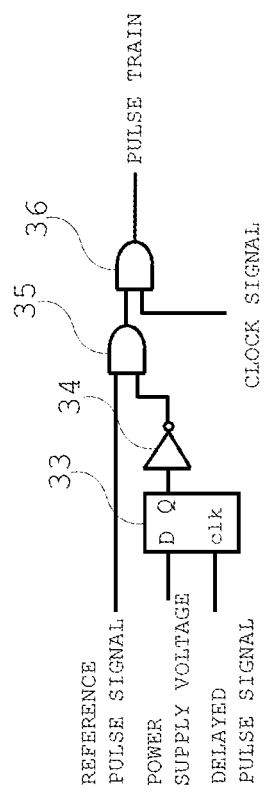
FIG. 3 illustrates an another configuration of an output circuit.

In electronic circuity 100 according to Embodiment 1, the output circuit 30 is composed of the EXOR gate 31 and the AND gate 32. Alternatively, for example, the output circuit 30 may be composed of a D flip-flop 33, a NOT gate 34, and AND gates 35 and 36, as shown in FIG. 3. In D flip-flop 33, a power supply voltage is input to the D terminal and a delayed pulse signal is input to the clock terminal.

Embodiment 2

Figure 4:
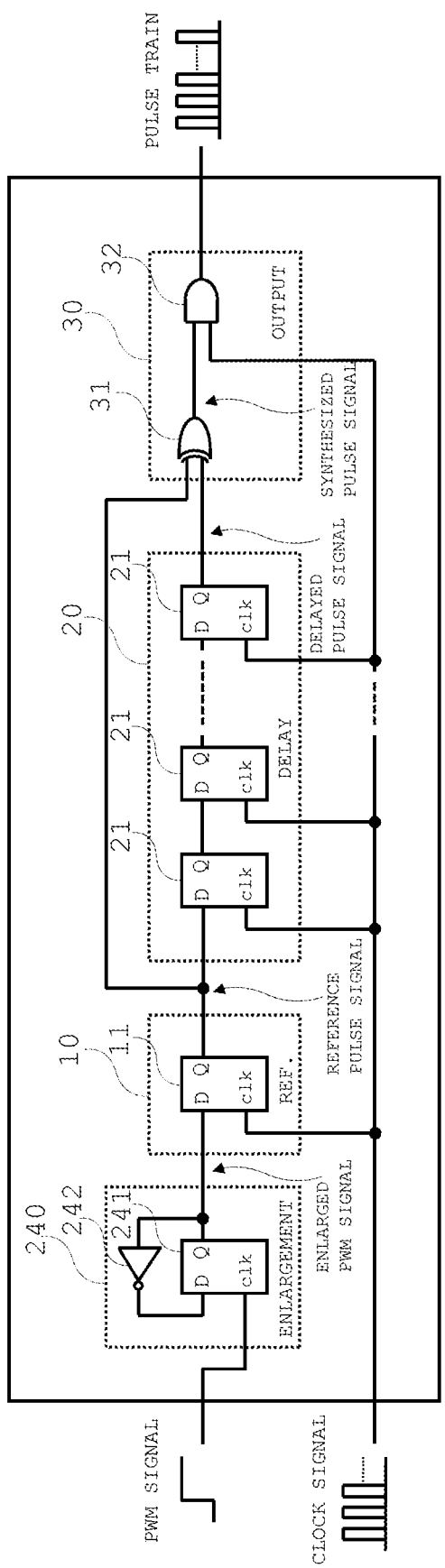
FIG. 4 illustrates a configuration of electronic circuitry according to Embodiment 2.
Figure 5:
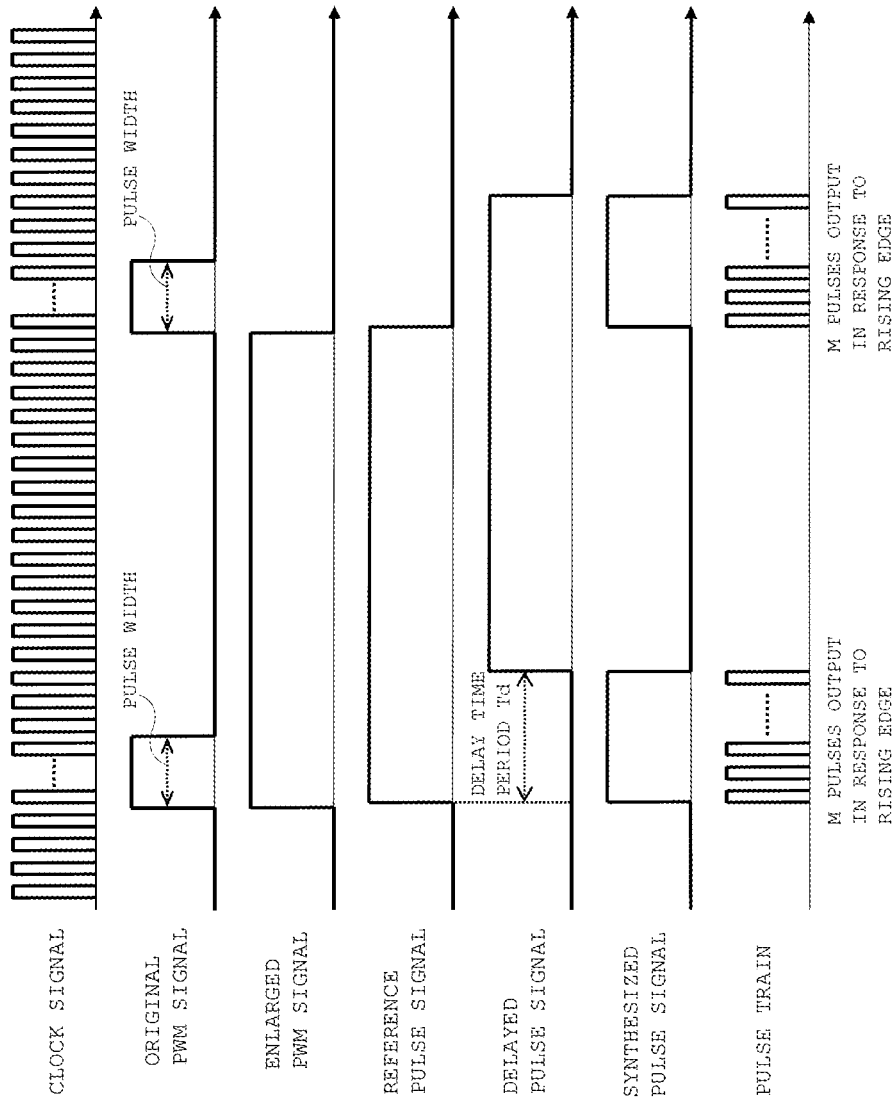
FIG. 5 is a timing chart of respective signals at components of electronic circuitry according to Embodiment 2.
Figure 6:
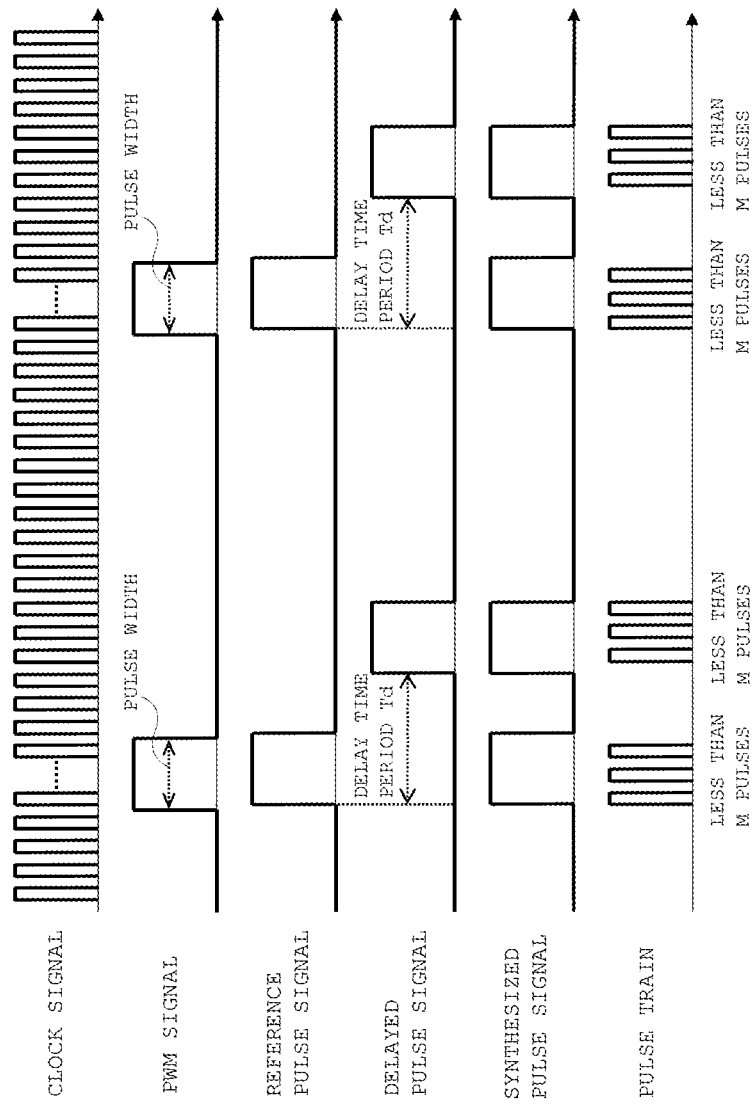
FIG. 6 is a timing chart showing an example where a pulse train is not correctly generated.

FIG. 4 illustrates a configuration of electronic circuitry 200 according to Embodiment 2. FIG. 5 is a timing chart of respective signals at components of electronic circuitry 200. As shown in FIG. 6, electronic circuitry 100 according to Embodiment 1 can generate only less than "M" pulses if the pulse width of the PWM signal is smaller than the delay time period "Td."

To overcome the above problem, electronic circuitry 200 according to Embodiment 2 comprises an enlargement circuit 240 which enlarges a pulse width of a PWM signal in accordance with the PWM signal. For example, the enlargement circuit 240 is composed of a ½ frequency division circuit including a D flip-flop 241 and a NOT gate 242.

When a PWM signal is input to the enlargement circuit 240, an enlarged PWM signal is output. The enlarged PWM signal rises in sync with an edge of the original PWM signal and falls in sync with a next edge of the same type of the original PWM signal. For example, in FIG. 5, the enlarged PWM signal rises in sync with a rising edge of the original PWM signal and falls in sync with a next rising edge of the original PWM signal. This makes a pulse width of a reference pulse signal larger than a delay time period "Td" and allows generation of a pulse train including "M" pulses.

Figure 7:
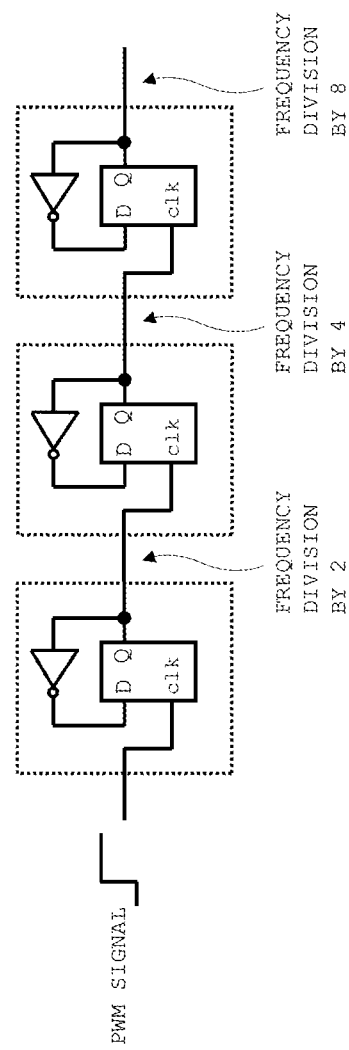
FIG. 7 illustrates a configuration of an enlargement circuit constructed by connecting a plurality of frequency division circuits.

Note that, if the delay time period "Td" is larger than a pulse width of a PWM signal even after the pulse width is enlarged by a ½ frequency division circuit, an enlargement circuit may be composed of a ¼ frequency division circuit, a ⅛ frequency division circuit, or the like obtained by connecting a plurality of ½ frequency division circuits, as shown in FIG. 7.

As described above, electronic circuitry 200 according Embodiment 2 comprises the enlargement circuit 240 that enlarges a pulse width of an input pulse signal in accordance with a PWM signal as the input pulse signal. With this feature, electronic circuitry 200 according to Embodiment 2 can generate a pulse train including "M" pulses in accordance with an input pulse signal even if a pulse width of the input pulse signal is small.

Embodiment 3

Figure 8:
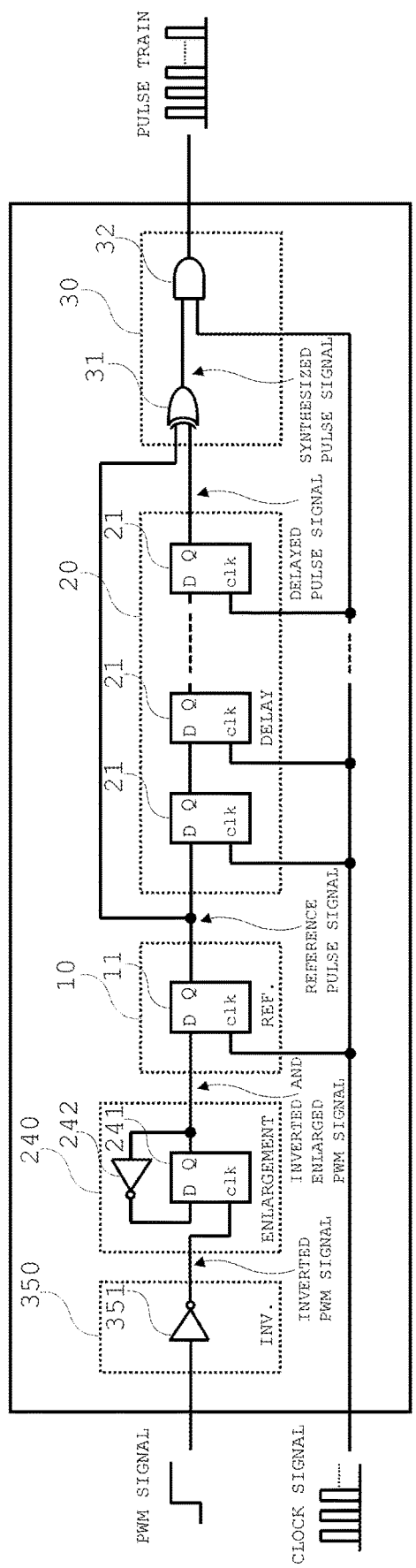
FIG. 8 illustrates a configuration of electronic circuitry according to Embodiment 3.
Figure 9:
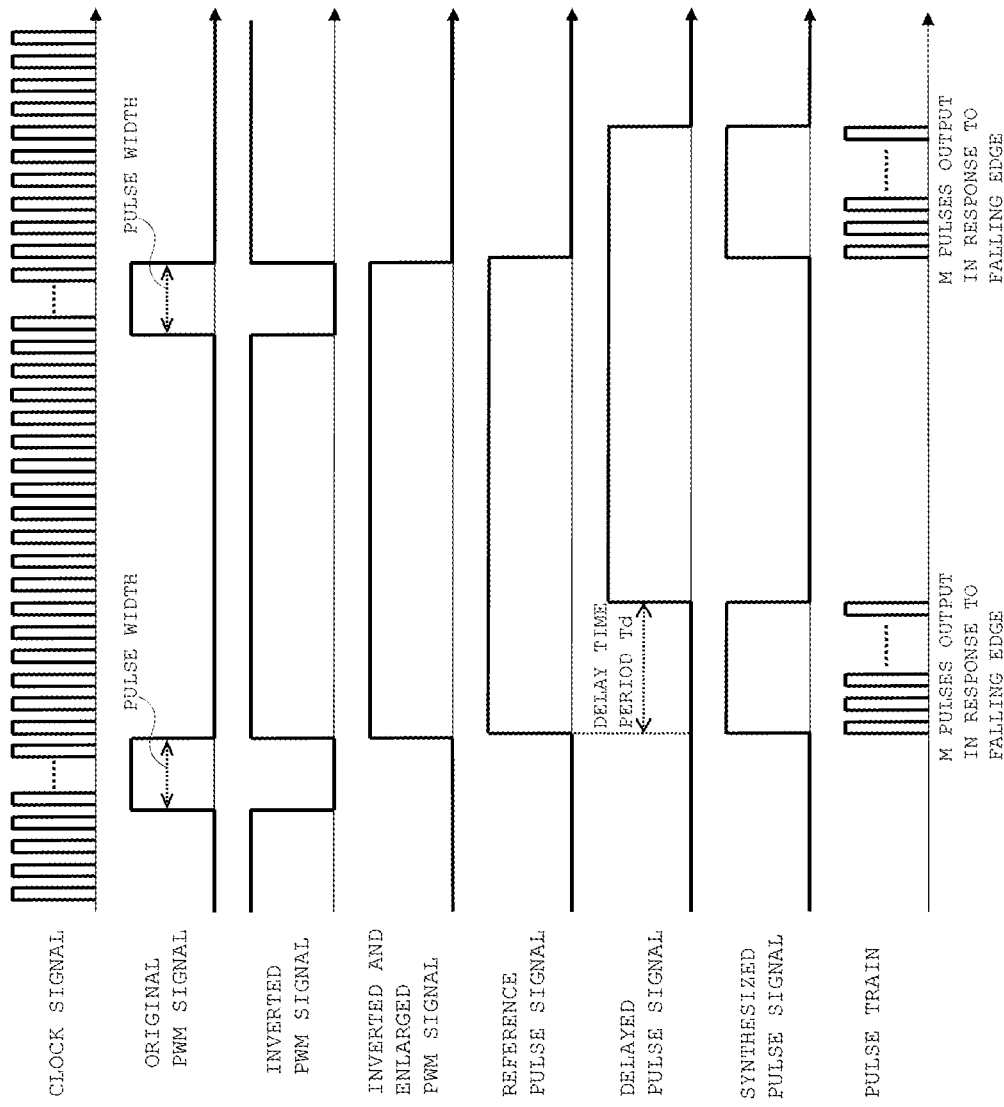
FIG. 9 is a timing chart of respective signals at components of electronic circuitry according to Embodiment 3.

FIG. 8 illustrates a configuration of electronic circuitry 300 according to Embodiment 3. FIG. 9 is a timing chart of respective signals at components of electronic circuitry 300. Electronic circuitry 200 according to Embodiment 2 generates the pulse train in response to the rising edge (first edge) of the PWM signal. In contrast, electronic circuitry 300 according to Embodiment 4 generates a pulse train in response to a falling edge (second edge) of a PWM signal. That is, electronic circuitry 300 generates a pulse train in response to a PWM edge of a different type from electronic circuitry 200.

In particular, electronic circuitry 300 comprises an inversion circuit 350 which logically inverts a PWM signal and inputs the logically inverted PWM signal to the enlargement circuit 240. For example, the inversion circuit 350 is composed of a NOT gate 351. When the logically inverted PWM signal is input to the enlargement circuit 240, the logically inverted and enlarged PWM signal output from the enlargement circuit 240 rises in sync with an edge of the original PWM signal and falls in sync with a next edge of the same type of the original PWM signal. For example, in FIG. 9, the logically inverted and enlarged PWM signal output from the enlargement circuit 240 rises in sync with a falling edge of the original PWM signal and falls in sync with a next falling edge of the original PWM signal. For this reason, a pulse train including "M" pulses is generated in response to a falling edge of the original PWM signal.

As described above, electronic circuitry 300 according to Embodiment 3 comprises the inversion circuit 350 that logically inverts a PWM signal (input pulse signal) and inputs the logically inverted PWM signal to the enlargement circuit 240. With this feature, electronic circuitry 300 according to Embodiment 3 can generate a pulse train including "M" pulses in accordance with an input pulse signal even if a pulse width of the input pulse signal is small.

Embodiment 4

Figure 10:
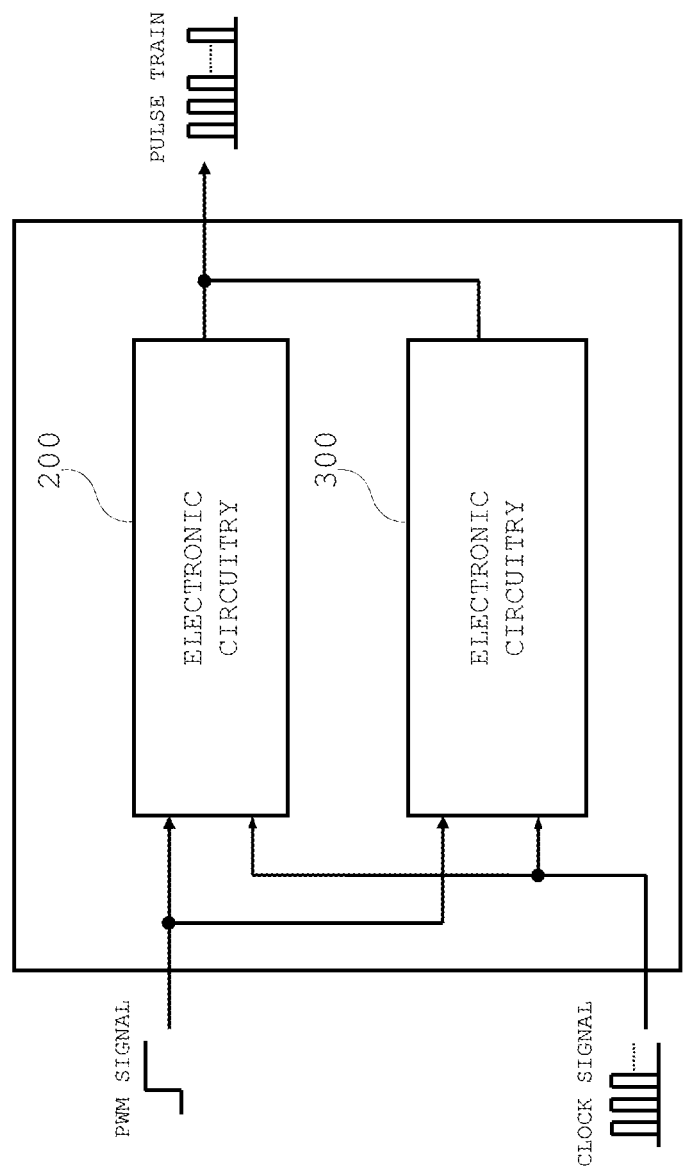
FIG. 10 illustrates a configuration of electronic circuitry according to Embodiment 4.

FIG. 10 illustrates a configuration of electronic circuitry 400 according to Embodiment 4. Electronic circuitry 400 comprises electronic circuitry 200 according to Embodiment 2 and electronic circuitry 300 according to Embodiment 3.

As described above, electronic circuitry 200 according to Embodiment 2 generates a pulse train including "M" pulses in response to an edge of the PWM signal (input pulse signal). Electronic circuitry 300 according to Embodiment 3 generates a pulse train including "M" pulses in response to an edge of a different type from electronic circuitry 200 in the PWM signal (input pulse signal).

Thus, electronic circuitry 400 according to Embodiment 4 can generate a pulse train including "M" pulses in response to each of rising edges (first edges) and falling edges (second edges) of an input pulse signal even if a pulse width of the input pulse signal is small. The delay circuit 20 in electronic circuitry 200 and the delay circuit 20 in electronic circuitry 300 may be a shared delay circuit. The output circuit 30 in electronic circuitry 200 and the output circuit 30 in electronic circuitry 300 may be a shared output circuit.

Embodiment 5

Figure 11:
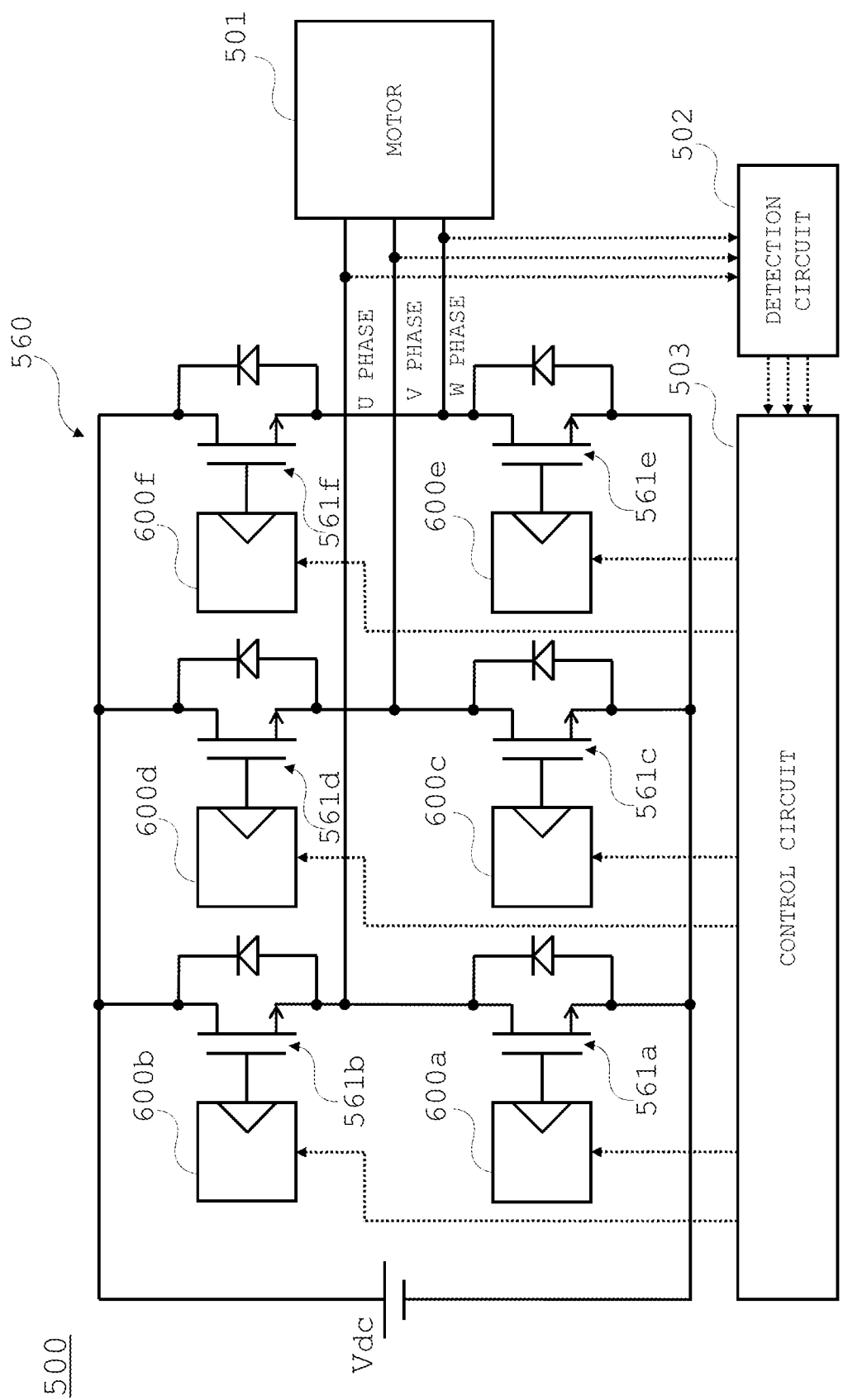
FIG. 11 illustrates a configuration of a motor control system according to Embodiment 5.

FIG. 11 illustrates a configuration of a motor control system 500 according to Embodiment 5. The motor control system 500 comprises a three-phase AC motor 501 as a load, a DC power supply Vdc, switching elements 561a to 561f constituting a three-phase inverter circuit 560, and drive circuits (which can also be referred to as "electronic circuitry") 600a to 600f which drive the switching elements 561a to 561f respectively. The motor control system 500 also comprises a detection circuit 502 which detects operating states of the switching elements 561a to 561f, and a control circuit 503 which controls the drive circuits 600a to 600f.

The switching element 561a and the switching element 561b are N-channel MOSFETs. The switching element 561a and the switching element 561b constitute a U-phase arm pair of the inverter circuit 560. The drive circuit 600a controls switching operation of the switching element 561a, i.e., turn-on and turn-off by controlling a gate current (drive signal) of the switching element 561a. The drive circuit 600b controls switching operation of the switching element 561b, i.e., turn-on and turn-off by controlling a gate current (drive signal) of the switching element 561b.

Similarly, the switching element 561c and the switching element 561d are N-channel MOSFETs. The switching element 561c and the switching element 561d constitute a V-phase arm pair of the inverter circuit 560. The drive circuit 600c controls switching operation of the switching element 561c by controlling a drive signal for the switching element 561c. The drive circuit 600d controls switching operation of the switching element 561d by controlling a drive signal for the switching element 561d.

Similarly, the switching element 561e and the switching element 561f are N-channel MOSFETs. The switching element 561e and the switching element 561f constitute a W-phase arm pair of the inverter circuit 560. The drive circuit 600e controls switching operation of the switching element 561e by controlling a drive signal for the switching element 561e. The drive circuit 600f controls switching operation of the switching element 561f by controlling a drive signal for the switching element 561f.

The detection circuit 502 detects the operating states of the switching elements 561a to 561f on the basis of respective current values of U phase, V phase and W phase of the motor 501, and transmits the operating states to the control circuit 503. Alternatively, the detection circuit 502 may detect the operating states of the switching elements 561a to 561f on the basis of temperature information obtained by a temperature sensor (not shown) incorporated in the motor 501. Alternatively, the detection circuit 502 may detect the operating states of the switching elements 561a to 561f on the basis of signals received from a microcomputer for control (not shown).

For each of the drive circuits 600a to 600f, the control circuit 503 supplies a PWM signal (command signal) which instructs switching operation of the corresponding switching element, a 3-bit selection signal for selecting waveform data of the drive signal for the corresponding switching element, and a clock signal, on the basis of the operating states of the switching elements 561a to 561f received from the detection circuit 502.

Figure 12:
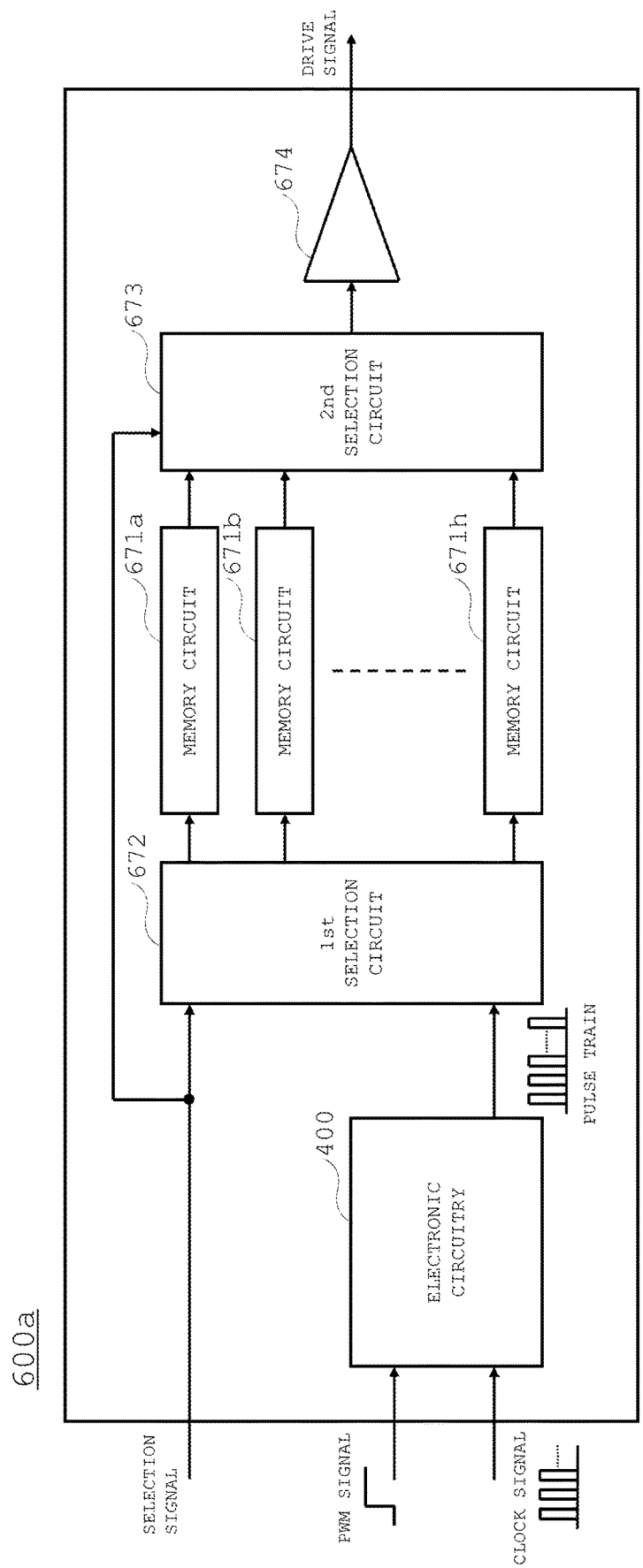
FIG. 12 illustrates a configuration of a drive circuit according to Embodiment 5.

FIG. 12 illustrates an internal configuration of the drive circuit 600a for the switching element 561a. Note that configurations of the other drive circuits 600b to 600f are the same, and thus hereinafter a description for the drive circuit 600a will be given as an example. The drive circuit 600a includes electronic circuitry 400 according to Embodiment 4, eight memory circuits 671a to 671h, a first selection circuit 672, a second selection circuit 673 and a signal generation circuit 674.

Electronic circuitry 400 generates a pulse train including M (=32) pulses synchronized with the clock signal in response to each of rising edges and falling edges of the PWM signal supplied from the control circuit 503.

Figure 13:
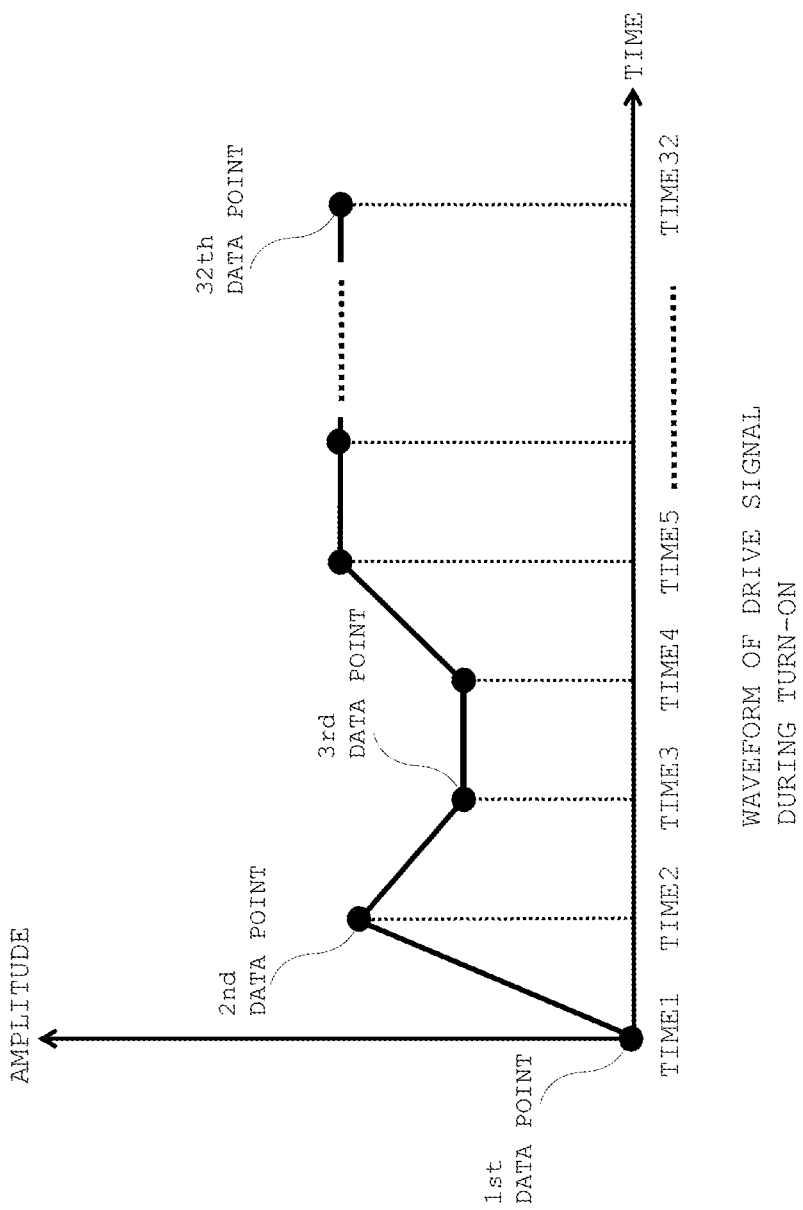
FIG. 13 illustrates an example of waveform data to be stored in a memory circuit.

The memory circuit 671a is constructed by lining up twelve 32-bit shift register circuits. Configurations of the other memory circuits 671b to 671h are the same. For a waveform of the drive signal for the switching element 561a during turn-on (which is theoretically or experimentally determined in advance), waveform data including 32 data points is obtained by sampling the waveform with sampling interval "Tc" in time direction and quantizing the sampled waveform with 12 bits in amplitude direction. The waveform data is then stored in the memory circuit 671a (see FIG. 13). That is, the waveform data including 32 data points quantized with 12 bits is stored in the memory circuit 671a.

Different versions of the waveform data of the drive signal for the switching element 561a during turn-on are stored in the memory circuits 671b to 671d. Thus, the drive circuit 600a holds four possible waveform data of the drive signal for the switching element 561a during turn-on. Note that the number of waveform data during turn-on held by the drive circuit 600a is not limited to four. The drive circuit 600a can hold an arbitrary number of waveform data by appropriately adjusting the number of memory circuits 671 and the number of bits of the selection signal.

Figure 14:
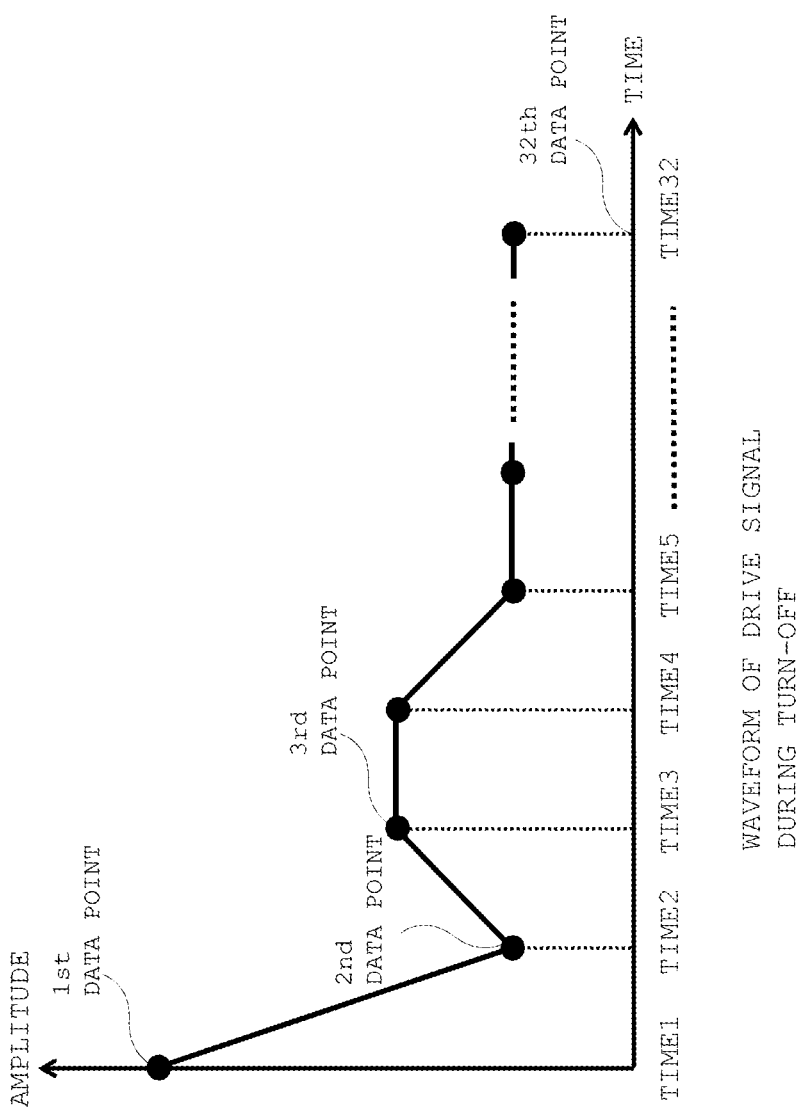
FIG. 14 illustrates an example of waveform data to be stored in a memory circuit.

Similarly, for a waveform of the drive signal of for switching element 561a during turn-off (which is theoretically or experimentally determined in advance), waveform data including 32 data points is obtained by sampling the waveform with sampling interval "Tc" in time direction and quantizing the sampled waveform with 12 bits in amplitude direction. The waveform data is then stored in the memory circuit 671e (see FIG. 14). That is, waveform data including 32 data points quantized with 12 bits is stored in the memory circuit 671e.

Different versions of the waveform data of the drive signal for the switching element 561a during turn-off are stored in the memory circuits 671f to 671h. Thus, the drive circuit 600a holds four possible waveform data of the drive signal during turn-off. Note that the number of waveform data during turn-off held by the drive circuit 600a is not limited to four. The drive circuit 600a can hold an arbitrary number of waveform data by appropriately adjusting the number of memory circuits 671 and the number of bits of the selection signal.

The first selection circuit 672 inputs the pulse train including M (=32) pulses generated by electronic circuitry 400 to any one of the memory circuits 671a to 671h on the basis of the 3-bit selection signal supplied from the control circuit 503.

Figure 15:
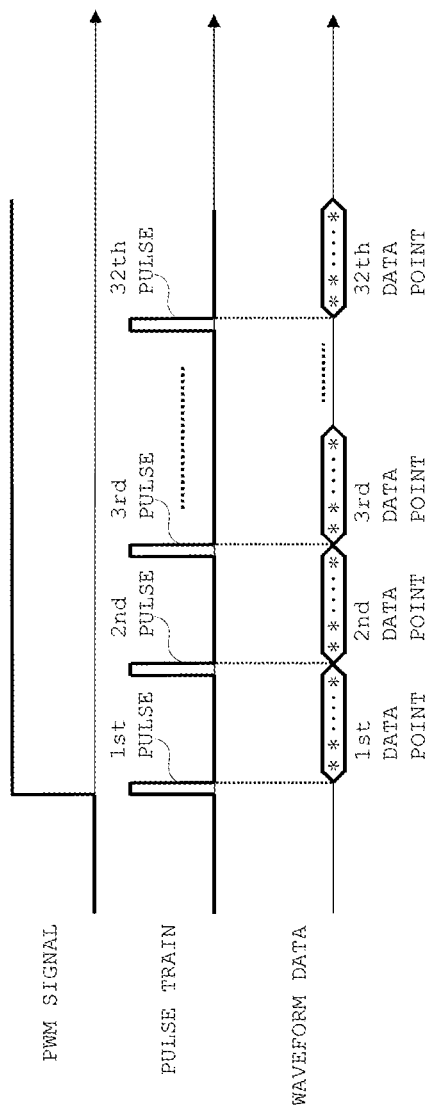
FIG. 15 illustrates a timing chart showing waveform data is output from a memory circuit.

When the pulse train including M (=32) pulses is input to any one of the memory circuits 671a to 671h, the waveform data including 32 data points quantized with 12 bits is sequentially output from the memory circuit 671 to which the pulse train is input, in sync with the pulses included in the pulse train. That is, one data point quantized with 12 bits included in the waveform data is output from the memory circuit 671 each time one pulse is input, and then the total 32 data points are sequentially output (see FIG. 15).

The second selection circuit 673 sequentially inputs, to the signal generation circuit 674, the 32 data points sequentially output from the memory circuit 671 to which the pulse train is input, on the basis of the 3-bit selection signal supplied from the control circuit 503.

The signal generation circuit 674 functions as a D/A converter having a 12-bit input, and generates a drive signal (analog signal) for the switching element 561a on the basis of the waveform data (digital signals) including 32 data points quantized with 12 bits which is input from the second selection circuit 673. The generated drive signal has, for example, a waveform obtained by connecting sampling points in FIG. 13 or FIG. 14 and is supplied to the switching element 561a.

As described above, a drive circuit 600 according to Embodiment 5 comprises electronic circuitry 400 according to Embodiment 4, the memory circuit 671 and the signal generation circuit 674. When a pulse train generated by electronic circuitry 400 is input, the memory circuit 671 sequentially output the waveform data including M data points in sync with pulses included in the pulse train. The signal generation circuit 674 generates a drive signal for a switching element 561 on the basis of the waveform data.

With these features, it is possible to theoretically or experimentally determine in advance waveforms of a drive signal for the switching element 561 so as to achieve both reduction in power loss and noise suppression and store waveform data in the memory circuits 671. The drive circuit 600 can generate a drive signal on the basis of waveform data read out from the memory circuit 671 and drive the switching element 561 by the drive signal.

The drive circuit 600 according to Embodiment 5 further comprises the plurality of memory circuits 671a to 671h, the first selection circuit 672 and the second selection circuit 673. The first selection circuit 672 selects any one of the memory circuits 671a to 671h and inputs a pulse train generated by electronic circuitry 400 to the selected memory circuit. The second selection circuit 673 inputs waveform data output from any one of the memory circuits 671a to 671h to the signal generation circuit 674. With these features, it is possible to select any one from among a plurality of waveform data and generate a drive signal for the switching element 561 on the basis of the selected waveform data.

The motor control system 500 according to Embodiment 5 comprises the above-described drive circuits 600, the detection circuit 502 and the control circuit 503. The detection circuit 502 detects the operating states of the switching elements 561. The control circuit 503 generates a PWM signal and a selection signal on the basis of the operating state of each switching element 561. With these features, the motor control system 500 according to Embodiment 5 can generate an optimum drive signal which achieves both reduction in power loss and noise suppression on the basis of the operating state of the switching element 561 and drive the switching element 561 by the drive signal.

Modifications

In the above-described Embodiment 5, the three-phase inverter circuit 560 is constructed from the switching elements 561a to 561f. Instead, a converter circuit may be constructed from a switching element and a diode.

The switching elements 561a to 561f are not limited to MOSFETs. For example, the switching elements 561a to 561f may be IGBTs. Alternatively, the switching elements 561a to 561f may be BJTs (Bipolar Junction Transistors).

As a semiconductor of which the switching elements 561a to 561f are made, various materials, such as Si (Silicon), SiC (Silicon Carbide) or GaN (Gallium Nitride) can be used.

If a pulse width of a PWM signal is sufficiently smaller than an output period (the delay time period "Td") for a pulse train with "M" pulses, electronic circuitry 100 according to Embodiment 1 may be used instead of electronic circuitry 400. If a pulse train is desired to be generated in response to only each rising edge of a PWM signal, electronic circuitry 200 according to Embodiment 2 may be used instead of electronic circuitry 400. Similarly, if a pulse train is desired to be generated in response to only each falling edge of a PWM signal, electronic circuitry 300 according to Embodiment 3 may be used instead of electronic circuitry 400.

Although several embodiments have been described, the embodiments are presented as examples and are not intended to limit the scope of embodiments. The embodiments can be carried out in various other forms, and various omissions, replacements, changes, and combinations can be made without departing from the gist of the embodiments. The embodiments and modifications thereof are included in the scope and gist of the embodiments, and are included in the claims and equivalents thereof.

Note that embodiments can take the following configurations.

[1] Configuration of Pulse Train Generation Circuit

An electronic circuitry comprising:
a reference circuit configured to generate a reference pulse signal synchronized with a clock signal on the basis of an input pulse signal,
a delay circuit configured to delay the reference pulse signal and generate a delayed pulse signal, and
an output circuit configured to output a pulse train including a plurality of pulses synchronized with the clock signal on the basis of the reference pulse signal and the delayed pulse signal, and the clock signal.

[2] Relationship Between Delay Time Period "Td" and "M"

The electronic circuitry according to 1, wherein
a delay time period of the delay circuit is set to satisfy Tc*(M−1)<Td<=Tc*M, where "Td" is the delay time period, "Tc" is a period of the clock signal, and "M" is a number of the plurality of pulses included in the pulse train.

[3] Configuration of Output Circuit

The electronic circuitry according to 1 or 2, wherein
the output circuit includes:
a synthesis circuit configured to generate a synthesized pulse signal having a pulse width corresponding to the delay time period on the basis of the reference pulse signal and the delayed pulse signal, and
a generation circuit configured to generate a pulse train including a plurality of pulses synchronized with the clock signal on the basis of the synthesized pulse signal and the clock signal.

[4] Corresponding to Narrow PWM Signal (Rising Edge Only)

The electronic circuitry according to any of 1 to 3, further comprising:
an enlargement circuit configured to enlarge a pulse width of the input pulse signal and input an enlarged input pulse signal to the reference circuit, in sync with a first edge of the input pulse signal.

[5] Falling Edge Only

The electronic circuitry according to [4], further comprising:
an inversion circuit configured to logically invert the input pulse signal and outputs a logically inverted input pulse signal, wherein
the enlargement circuit enlarges a pulse width of the logically inverted input pulse signal and input a logically inverted and enlarged input pulse signal to the reference circuit, in sync with a first edge of the logically inverted input pulse signal.

[6] Rising Edge+Falling Edge

The electronic circuitry according to any of 1 to 3, further comprising:
a first enlargement circuit configured to enlarge a pulse width of the input pulse signal and input an enlarged input pulse signal to the reference circuit, in sync with a first edge of the input pulse signal,
an inversion circuit configured to logically invert the input pulse signal and outputs a logically inverted input pulse signal, and
a second enlargement circuit configured to enlarge a pulse width of the logically inverted input pulse signal and input a logically inverted and enlarged input pulse signal to the reference circuit, in sync with a first edge of the logically inverted input pulse signal.

[7] Drive Circuit

A electronic circuitry comprising:
a reference circuit configured to generate a reference pulse signal synchronized with a clock signal on the basis of an input pulse signal,
a delay circuit configured to delay the reference pulse signal and generate a delayed pulse signal,
an output circuit configured to output a pulse train including a plurality of pulses synchronized with the clock signal on the basis of the reference pulse signal and the delayed pulse signal, and the clock signal, and
a memory circuit configured to sequentially output waveform data in sync with the pulses included in the pulse train when the pulse train generated by the output circuit is input, and
a signal generation circuit configured to generate a drive signal for a switching element on the basis of the waveform data.

[8] Drive Circuit

The electronic circuitry according to [7], further comprising:
a plurality of memory circuits constituting the memory circuit,
a first selection circuit configured to select any one of the plurality of memory circuits and input the pulse train generated by the output circuit to the selected memory circuit, on the basis of a selection signal, and
a second selection circuit configured to input the waveform data output from any one of the plurality of memory circuits to the signal generation circuit on the basis of the selection signal.

[9] Control System

A control system comprising:
a reference circuit configured to generate a reference pulse signal synchronized with a clock signal on the basis of an input pulse signal,
a delay circuit configured to delay the reference pulse signal and generate a delayed pulse signal,
an output circuit configured to output a pulse train including a plurality of pulses synchronized with the clock signal on the basis of the reference pulse signal and the delayed pulse signal, and the clock signal,
a plurality of memory circuits configured to sequentially output waveform data in sync with the pulses included in the pulse train when the pulse train generated by the output circuit is input,
a signal generation circuit configured to generate a drive signal for a switching element on the basis of the waveform data,
a first selection circuit configured to select any one of the plurality of memory circuits and input the pulse train generated by the output circuit to the selected memory circuit, on the basis of a selection signal,
a second selection circuit configured to input the waveform data output from any one of the plurality of memory circuits to the signal generation circuit on the basis of the selection signal,
a detection circuit configured to detect an operating state of the switching element, and
a control circuit configured to generate the input pulse signal and the selection signal on the basis of the operating state.

The invention claimed is:

1. An electronic circuitry comprising:
a reference circuit configured to generate a reference pulse signal synchronized with a clock signal on the basis of an input pulse signal;
a delay circuit configured to delay the reference pulse signal and generate a delayed pulse signal; and
an output circuit configured to output a pulse train including a plurality of pulses synchronized with the clock signal on the basis of the reference pulse signal and the delayed pulse signal, and the clock signal.

2. The electronic circuitry according to claim 1, wherein a delay time period of the delay circuit is set to satisfy $Tc*(M-1)<Td<=Tc*M$, where "Td" is the delay time period, "Tc" is a period of the clock signal, and "M" is a number of the plurality of pulses included in the pulse train.

3. The electronic circuitry according to claim 1, wherein the output circuit includes:
a synthesis circuit configured to generate a synthesized pulse signal having a pulse width corresponding to the delay time period on the basis of the reference pulse signal and the delayed pulse signal, and
a generation circuit configured to generate a pulse train including a plurality of pulses synchronized with the clock signal on the basis of the synthesized pulse signal and the clock signal.

4. The electronic circuitry according to claim 1, further comprising:
an enlargement circuit configured to enlarge a pulse width of the input pulse signal and input an enlarged input pulse signal to the reference circuit, in sync with a first edge of the input pulse signal.

5. The electronic circuitry according to claim 4, further comprising:
an inversion circuit configured to logically invert the input pulse signal and outputs a logically inverted input pulse signal, wherein
the enlargement circuit enlarges a pulse width of the logically inverted input pulse signal and input a logically inverted and enlarged input pulse signal to the reference circuit, in sync with a first edge of the logically inverted input pulse signal.

6. The electronic circuitry according to claim 1, further comprising:
a first enlargement circuit configured to enlarge a pulse width of the input pulse signal and input an enlarged input pulse signal to the reference circuit, in sync with a first edge of the input pulse signal;
an inversion circuit configured to logically invert the input pulse signal and outputs a logically inverted input pulse signal; and
a second enlargement circuit configured to enlarge a pulse width of the logically inverted input pulse signal and input a logically inverted and enlarged input pulse signal to the reference circuit, in sync with a first edge of the logically inverted input pulse signal.

7. A electronic circuitry comprising:
a reference circuit configured to generate a reference pulse signal synchronized with a clock signal on the basis of an input pulse signal;
a delay circuit configured to delay the reference pulse signal and generate a delayed pulse signal;
an output circuit configured to output a pulse train including a plurality of pulses synchronized with the clock signal on the basis of the reference pulse signal and the delayed pulse signal, and the clock signal;
a memory circuit configured to sequentially output waveform data in sync with the pulses included in the pulse train when the pulse train generated by the output circuit is input; and
a signal generation circuit configured to generate a drive signal for a switching element on the basis of the waveform data.

8. The electronic circuitry according to claim 7, further comprising:
a plurality of memory circuits constituting the memory circuit;
a first selection circuit configured to select any one of the plurality of memory circuits and input the pulse train generated by the output circuit to the selected memory circuit, on the basis of a selection signal; and
a second selection circuit configured to input the waveform data output from any one of the plurality of memory circuits to the signal generation circuit on the basis of the selection signal.

9. A control system comprising:
a reference circuit configured to generate a reference pulse signal synchronized with a clock signal on the basis of an input pulse signal;
a delay circuit configured to delay the reference pulse signal and generate a delayed pulse signal;
an output circuit configured to output a pulse train including a plurality of pulses synchronized with the clock signal on the basis of the reference pulse signal and the delayed pulse signal, and the clock signal;
a plurality of memory circuits configured to sequentially output waveform data in sync with the pulses included in the pulse train when the pulse train generated by the output circuit is input;
a signal generation circuit configured to generate a drive signal for a switching element on the basis of the waveform data;
a first selection circuit configured to select any one of the plurality of memory circuits and input the pulse train generated by the output circuit to the selected memory circuit, on the basis of a selection signal;
a second selection circuit configured to input the waveform data output from any one of the plurality of memory circuits to the signal generation circuit on the basis of the selection signal;
a detection circuit configured to detect an operating state of the switching element; and
a control circuit configured to generate the input pulse signal and the selection signal on the basis of the operating state.

* * * * *

UNITED STATES PATENT AND TRADEMARK OFFICE
CERTIFICATE OF CORRECTION

| | | |
|---|---|---|
| PATENT NO. | : 12,101,093 B2 | Page 1 of 1 |
| APPLICATION NO. | : 18/185071 | |
| DATED | : September 24, 2024 | |
| INVENTOR(S) | : Kawai | |

It is certified that error appears in the above-identified patent and that said Letters Patent is hereby corrected as shown below:

In the Claims

• In Claim 5, Column 12, Line 23, "and input" should read --and inputs--.

Signed and Sealed this
Tenth Day of December, 2024

*Katherine Kelly Vidal*

Katherine Kelly Vidal
*Director of the United States Patent and Trademark Office*